United States Patent [19]

Cole, III et al.

[11] Patent Number: 5,031,199

[45] Date of Patent: Jul. 9, 1991

[54] X-RAY LITHOGRAPHY BEAMLINE METHOD AND APPARATUS

[75] Inventors: Richard K. Cole, III, Stoughton; Franco Cerrina, Madison, both of Wis.

[73] Assignee: Wisconsin Alumni Research Foundation, Madison, Wis.

[21] Appl. No.: 533,536

[22] Filed: Jun. 5, 1990

[51] Int. Cl.$^5$ .............................................. G21K 5/04
[52] U.S. Cl. ...................................... 378/34; 378/84; 378/85
[58] Field of Search .................. 378/34, 35, 84, 85, 378/147, 146, 156, 159, 161

[56] References Cited

U.S. PATENT DOCUMENTS

| | | |
|---|---|---|
| 4,028,547 | 5/1977 | Eisenberger . |
| 4,181,839 | 1/1980 | Hatton et al. . |
| 4,242,588 | 12/1980 | Silk et al. . |
| 4,516,254 | 5/1985 | Komeyama et al. . |
| 4,679,221 | 7/1987 | O'Brien et al. . |
| 4,748,646 | 5/1988 | Osada et al. . |
| 4,803,713 | 2/1989 | Fujii . |

FOREIGN PATENT DOCUMENTS 0156000  8/1985  Japan .................................... 378/34

OTHER PUBLICATIONS

R. J. Rosser, P. M. J. H. Wormell, "Saddle Toroid Arrays: Novel Grazing Incidence for Synchrotron X-ray Lithography": Blackett Laboratory, Imperial College, England, publication date unknown.

Takashi Kaneko, et al., "A Beamline and Its Components for SR Lithography," Japanese Journal of Applied Physics, vol. 28, No. 10, Oct. 1989, pp. 2080-2083.

Primary Examiner—Carolyn E. Fields
Assistant Examiner—David P. Porta
Attorney, Agent, or Firm—Foley & Lardner

[57] ABSTRACT

A beamline for X-ray lithography receives a fan of synchrotron radiation with a first mirror which has a concave/concave (toroidal) shape. This mirror collects the fan of X-rays and partially collimates the beam horizontally. The beam is then intercepted by a second refocusing mirror which has a saddle toroidal shape with a major concave radius of curvature and a minor convex radius of curvature. The refocusing mirror acts to collimate the X-rays horizontally and to focus the X-rays vertically. A third flat mirror may be interposed in the beam reflected from the second mirror and can pivot to change the angle of incidence to cause the beam to scan across the image plane. The two toroidal mirrors preferably have approximately a 2 degree grazing angle of incidence of the beam. The two toroidal mirrors act together to provide a very uniform image with a uniform power distribution in the beam. The beamline provides X-rays that are well matched to the mask and photo-resist requirements of X-ray lithography, in that X-rays above and below the desired process window of X-ray energies are substantially attenuated.

19 Claims, 17 Drawing Sheets

X-RAY LITHOGRAPHY BEAMLINE METHOD AND APPARATUS

This invention was made with United States government support awarded by the Office of Naval Research (ONR), Grant #(s): N00014-89-J-2017. The United States government has certain rights in this invention.

FIELD OF THE INVENTION

This invention pertains generally to the field of X-ray systems and particularly to X-ray lithography utilizing synchrotron radiation.

BACKGROUND OF THE INVENTION

In the manufacture of microelectronic devices, photolithographic techniques are commonly utilized. To obtain greater resolution in the formation of microstructures than can be obtained with visible light wavelengths, efforts have been made to use shorter wavelength radiation, particularly X-rays. To achieve adequate resolution, for example, 0.25 micron lithography, the beam of X-rays must display high spectral and spatial uniformity at the plane of the wafer being exposed. Synchrotrons are particularly promising X-ray sources for lithography because they provide a very stable and well defined source of X-rays. The electrons orbiting inside the vacuum enclosure of the synchrotron emit electromagnetic radiation as they are bent by the magnetic fields used to define the path of travel. This electromagnetic radiation is an unavoidable consequence of changing the direction of travel of the electrons and is typically referred to as synchrotron radiation. The energy that the electrons lose in the form of synchrotron radiation must be regained at some point in their orbit around the ring, or they will spiral in from the desired path and be lost. Orbiting electrons can also be lost through collisions with residual gas atoms and ions within the vacuum chamber. Thus, ultra-high quality vacuums are necessary to obtain satisfactory lifetimes of the stored beam.

The synchrotron radiation is emitted in a continuous spectrum of "light", ranging from radio and infrared wavelengths upwards through the spectrum, without the intense, narrow peaks associated with other sources. The shape of a spectral curve of a representative synchrotron storage ring, the Aladdin ring, is shown in FIG. 1. All synchrotrons have similar curves that define their spectra, which vary from one another in intensity and the critical photon energy. The critical photon energy $E_c$ is determined by the radius of curvature of the path of the electrons and their kinetic energy and is given by the relationship:

$$E_c = \frac{3hc}{4\pi R_m} \left( \frac{E_e}{m_e C^2} \right)^3$$

where $R_m$ is the bending radius, $m_e$ is the electron's rest mass, h is Plank's constant, $E_e$ is the energy of the electron beam and c is the speed of light. Half of the total power is radiated above the critical energy and half below. The higher the kinetic energy of the electrons, or the steeper the bend of the orbit, the higher the critical photon energy. By knowing this information, the synchrotron can be designed to match the spectral requirements of the user.

Parameters describing the size of the source of synchrotron radiation and the rate at which it is diverging from the source are also of importance. Since the electrons are the source of synchrotron radiation, the cross section of the electron beam defines the cross section of the source. Within the plane of the orbit the light is emitted in a broad, continuous fan, which is tangent to the path of the electrons, as illustrated in FIG. 2—which shows a section of a synchrotron 20 having an orbiting electron beam 21 and a fan of synchrotron radiation indicated by the arrows 22. FIG. 3 shows the distribution of the flux of the synchrotron radiation at a plane perpendicular to the plane of the ring, with the distribution of flux indicated by the density of the dots shown within the box 25 in FIG. 3. The flux is substantially uniform horizontally, as shown in the graph at 26, and exhibits a Gaussian distribution profile vertically as shown by the graph 27 in FIG. 3.

Because of the relatively small height and width of the electron beam, it acts as a point source of radiation, providing crisp images at an exposure plane which is typically 8 meters or more away from the ring. However, at a distance of 8 meters a one inch wide exposure field typically collects only 3.2 milli-radians of the available radiation. There are two ways to improve the power incident at the photo-resist: either shorten the beamline or install focusing elements. The use of focusing elements has the potential advantage of collecting X-rays from a very wide aperture and providing a wide image with a very small vertical heigth. However, the use of focusing elements results in a loss of power at each element because of low reflectivity of the X-rays and introduces aberrations. To operate within acceptable values of reflectivity and maximize the delived power, it is necessary to work at grazing angles (i.e., at angles of incidence $\theta$ from a normal to the surface such that $86° \leq \theta \leq 89.5°$). Furthermore, because synchrotron radiation is emitted in a horizontal fan, the use of grazing incidence optics is particularly suitable. The small vertical divergence of the synchrotron radiation implies that a wide horizontal mirror can accept a large fan of light at a small grazing angle without being unacceptably long.

The optical system (beamline) must deliver uniform power over the exposure area, typically 2 inches horizontally by 1 inch vertically. This can be achieved by (a) expanding the X-ray beam or (b) scanning the X-ray beam across the image. The first approach is not compatible with vacuum isolation. The present invention is well suited to the second approach, both in the form of mask-wafer scanning and beam rastering.

An X-ray lithography beamline suitable for production purposes should deliver a stable and well characterized flux of X-rays to the exposure field. Desirable characteristics for an X-ray lithography beamline for production purposes include uniform power density over the entire scan region, large collection angle near the source, minimal losses of useful X-rays, a modular optical package with stable, inexpensive recoatable optical elements, and an exposure field measuring at least 1 inch by 1 inch and preferably 2 inches by 2 inches.

Various beamline designs have been proposed for use in X-ray lithography. These include straight-through transmission systems, for example as in B. Lai, et al., "University of Wisconsin X-Ray Lithography Beamline: First Results," Nucl. Instrum. Methods A 246, pp. 681 et seq., (1986); H. Oertel, et al., "Exposure Instrumentation For the Application of X-Ray Lithography Using Synchrotron Radiation," Rev. Sci. Instrum.

60(7), pp. 2140 et seq., 1989. Other systems have utilized planar optics to provide scanning and filtering capabilities. See, H. Betz, "High Resolution Lithography Using Synchrotron Radiation," Nucl. Instrum. Methods A 246, pp. 659 et seq., 1986; P. Pianetta, et al., "X-Ray Lithography and the Stanford Synchrotron Radiation Laboratory," Nucl. Instrum. Methods A 246, pp. 641 et seq., 1986; S. Qian, et al., "Lithography Beamline Design and Exposure Uniformity Controlling and Measuring," Rev. Sci. Instrum. 60(7), pp. 2148 et seq., 1989; E. Bernieri, et al., "Optimization of a Synchrotron Based X-Ray Lithographic System," Rev. Sci. Instrum. 60(7), pp. 2137 et seq., 1989; U.S. Pat. No. 4,803,713 to K. Fuiii entitled "X-Ray Lithography System Using Synchrotron Radiation"; E. Burattini, et al., "The Adone Wiggler X-Ray Lithography Beamline," Rev. Sci. Instrum. 60(7), pp. 2133 et seq., 1989. The use of single figured mirrors is proposed in the article by J. Warlaumont, "X-Ray Lithography in Storage Rings," Nucl. Instrum. Methods A 246, pp. 687 et seq., 1986. Other proposed systems include the use of Bragg reflections from cystalline surfaces as described in U.S. Pat. No. 4,028,547 entitled "X-Ray Photolithography" and microfabricated structures as described by R. J. Rosser, "Saddle Toroid Arrays: Novel Grazing Incidences Optics for Synchrotron X-Ray Lithography," Blackett Laboratory, Imperial College, London, England.

In an X-ray lithography system, the X-rays are directed through an X-ray mask and onto the photo-resist in those areas which are not shadowed by the non-transmissive pattern formed on the X-ray mask. Generally, the mask will consist of a thin substrate layer which is overlaid by an X-ray absorbing material in the desired pattern. The transmission of the X-ray mask substrate and the absorption of the photo-resist can be used to define the efficiency of the mask/resist system. Low energy X-rays striking the mask substrate are readily absorbed by the substrate material and never make it to the photo-resist. The energy of these absorbed photons goes into heating the mask, which can lead to undesirable side effects as expansion and distortion of the mask. Very high energy X-rays pass through the mask substrate, the absorber, and the photo-resist with few of the interactions that lead to image formation, reducing the usefulness of these photons. On the other hand, those high energy photons that do interact with the photo-resist may have passed through the absorber or "dark" areas of the pattern on the mask, thus reducing the contrast of the image produced in the resist. The product of the mask transmission and the photoresist absorption defines the system response. Thus, it is preferable that the X-ray flux which reaches the X-ray mask be mainly composed of photons which have an energy which lies in an optimal energy region referred to as the "Process Window." The Process Window will vary depending on the mask substrate and the photo-resist choosen, but in general the Process Window will be in the range of 600 eV to 2000 eV, as illustrated in FIG. 4 for the case of the 2 micron thick polycrystalline silicon mask substrate and a 1 micron thick Novolac photo-resist.

SUMMARY OF THE INVENTION

In accordance with the present invention, an X-ray beamline apparatus receives synchrotron radiation X-rays and collects and focuses the beam utilizing two grazing incidence X-ray mirrors which sequentially deflect the beam. The first or entrance mirror is a toroidal mirror which is concave along its length and width. It acts to collect the diverging fan of synchrotron radiation and to collimate partially the X-rays horizontally. The second or refocusing mirror is a concave-convex mirror which is concave in length but convex along its width. The refocusing mirror acts to collimate the light horizontally and to focus the light vertically. The curves of the reflecting surfaces of the two mirrors act in concert to provide a substantially uniform image with uniform power distribution. The two radii of curvatures of the two mirrors, the distance of separation between them, and the inclination angle of the refocusing mirror provide 6 degrees of freedom that can be used to optimize the shape of the image at the exposure field. Parameters of the two mirrors work in concert to produce a better shaped image than either mirror alone.

In addition to focusing and collimating the beam, the two mirrors serve to attenuate the high energy photons, e.g., those above approximately 2,200 electron volts (eV). Low energy photons (below 600 eV) are attenuated by a window closing the end of the beamline, preferably formed of beryllium, although a variety of other materials may be used for the window, such as silicon, silicon nitride, silicon carbide and diamond. The beamline system of the present invention thus effectively acts as a bandpass filter of photon energies to provide a spectral through-put that closely matches the desired Process Window, resulting in excellent carrier/absorber constrast and good photo-resist response, while simultaneously reducing the heat load on the mask.

To obtain scanning of the beam across the image field, a third flat mirror may be interposed in the beamline. This mirror is mounted to pivot slightly about an axis perpendicular to the beam at a low grazing angle of incidence to deflect the beam across the image field as desired.

Each of the mirrors is preferably housed within its own self-contained vacuum chamber, with sectioning dual gate valves between these chambers providing the capability of isolating an individual component. Each element of the system can be removed for modification, maintenance or repair without affecting the other elements. Very slight changes in the location and tilt of the two toroidal mirrors can be used to alter the distance to the final image without compromising either the power or the uniformity of the image shape.

The resulting beam at the image plane is very sharply defined and substantially uniform in flux across the horizontal width of the beam. Variations in flux across the beam can be compensated, if desired, in various ways, including, but not limited to, profiling the thickness of the exit window to achieve greater attenuation at some areas of the beam than in others, by using variable thickness filters and by using shaped beam apertures.

Further objects, features, and advantages of the invention will be apparent from the following detailed description when taken in conjunction with the accompanying drawings.

DETAILED DESCRIPTION OF THE INVENTION

Figure 1:
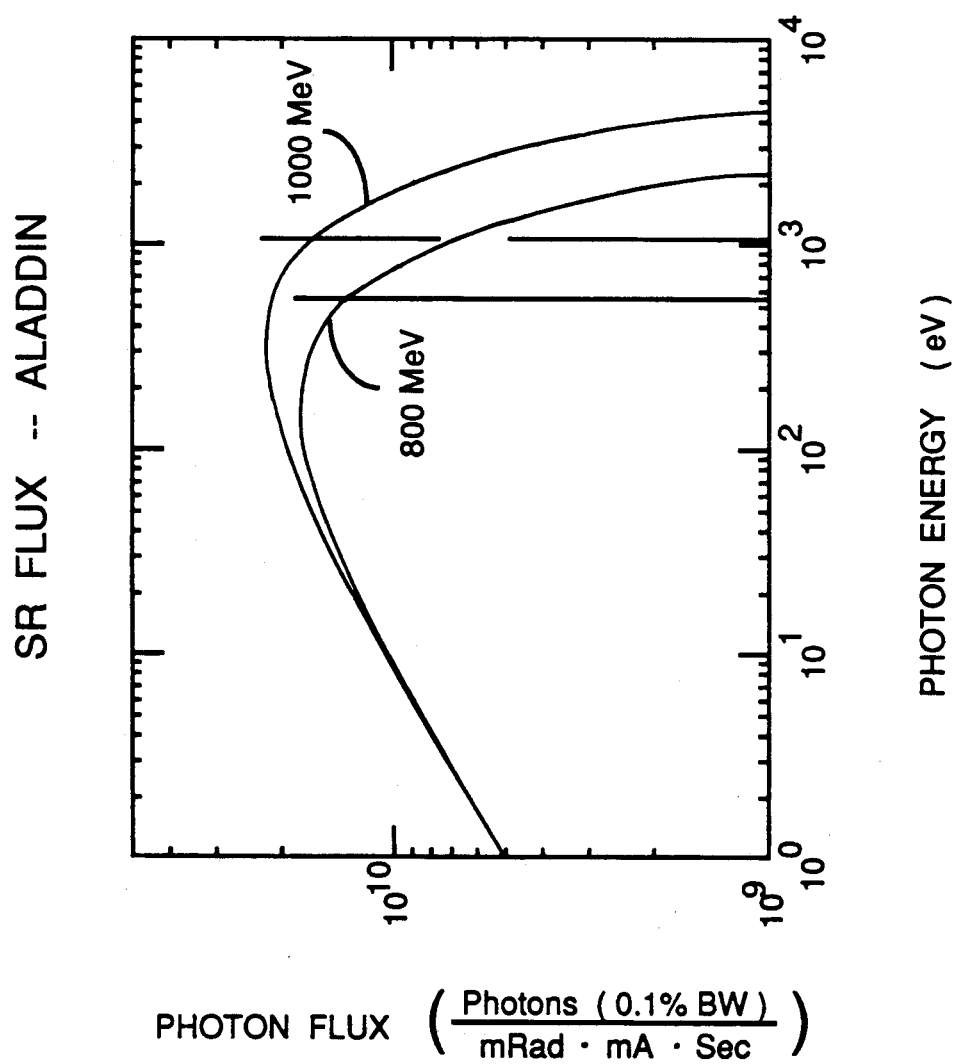
FIG. 1 are plots of spectra of emitted photon energy at two different electron energy levels for a synchrotron storage ring.
Figure 2:
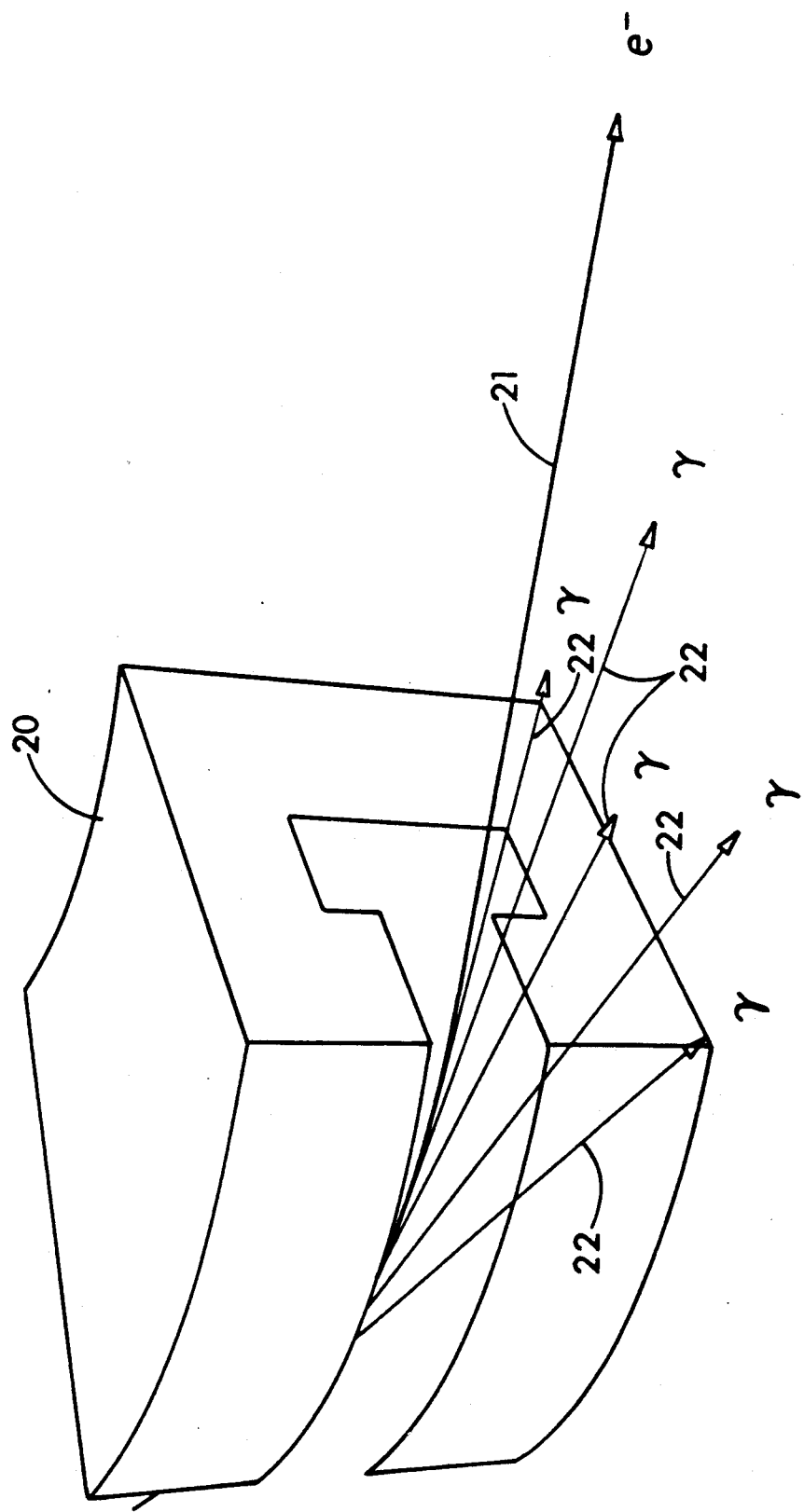
FIG. 2 is an illustrative drawing showing the fan of synchrotron radiation.
Figure 3:
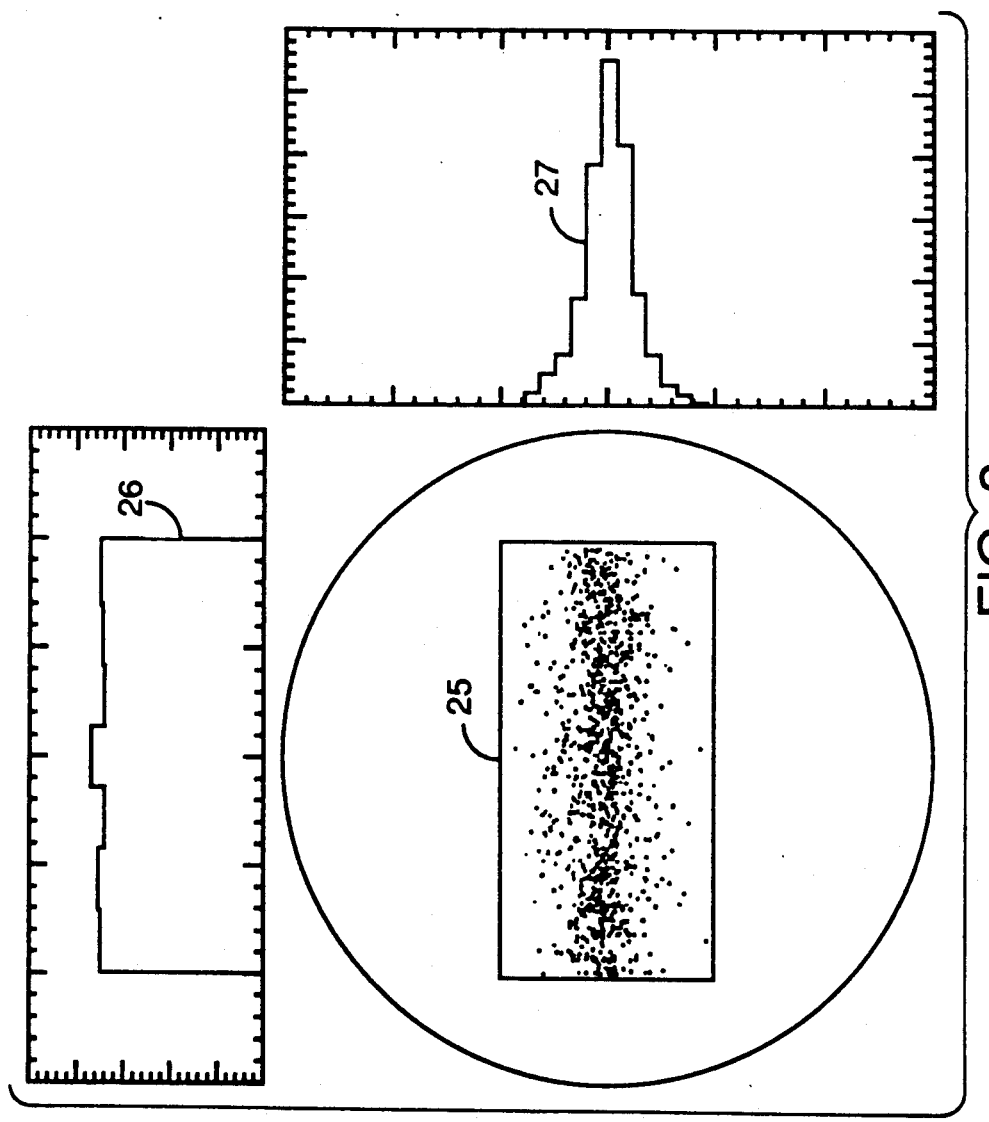
FIG. 3 are illustrative plots showing the vertical and horizontal distribution of X-ray flux in a cross section of the synchrotron radiation beam.
Figure 4:
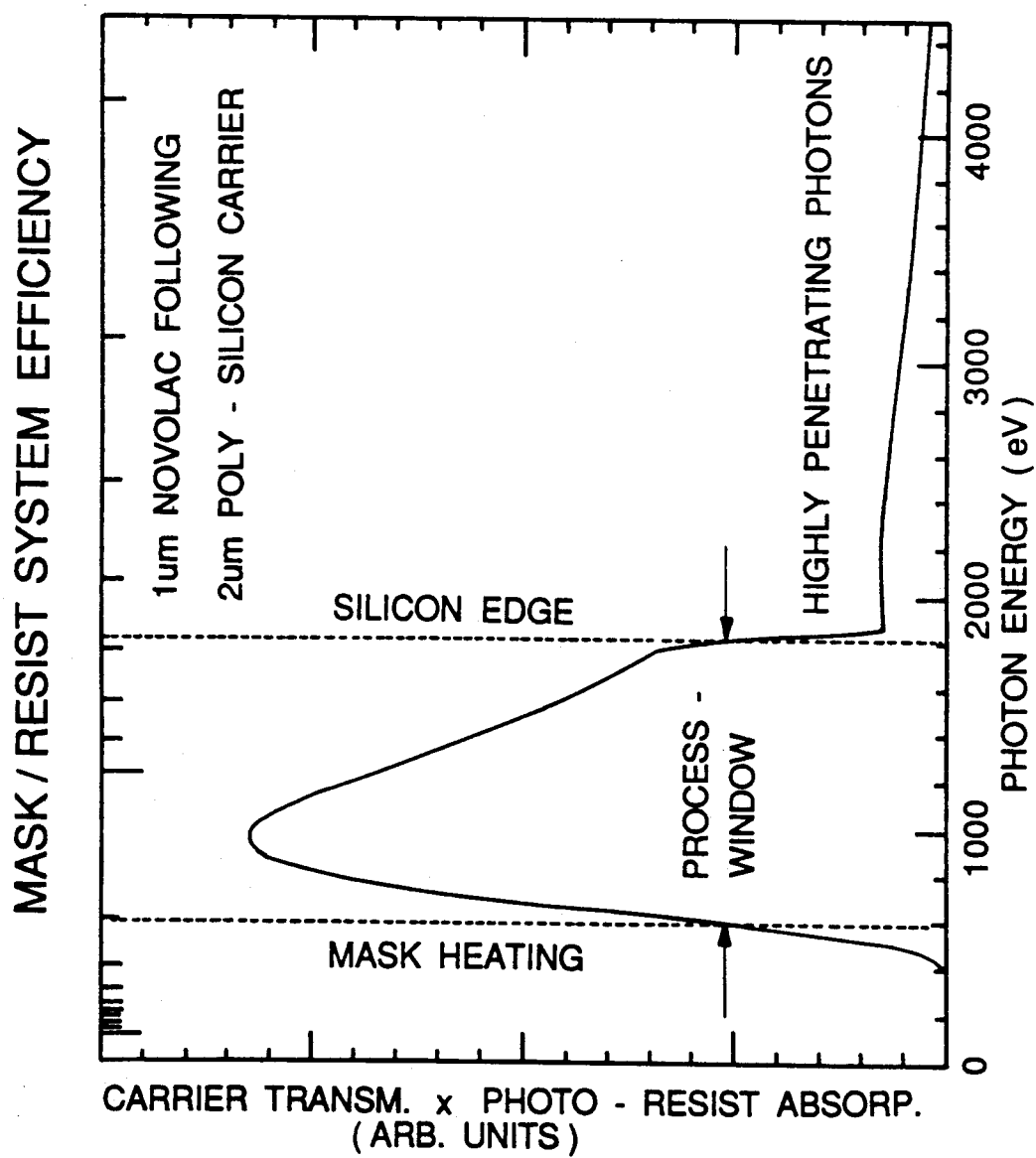
FIG. 4 is an illustrative graph showing an exemplay system response for a typical X-ray mask and photoresist, and which illustrates a preferred Process Window of photon energies.
Figure 5:
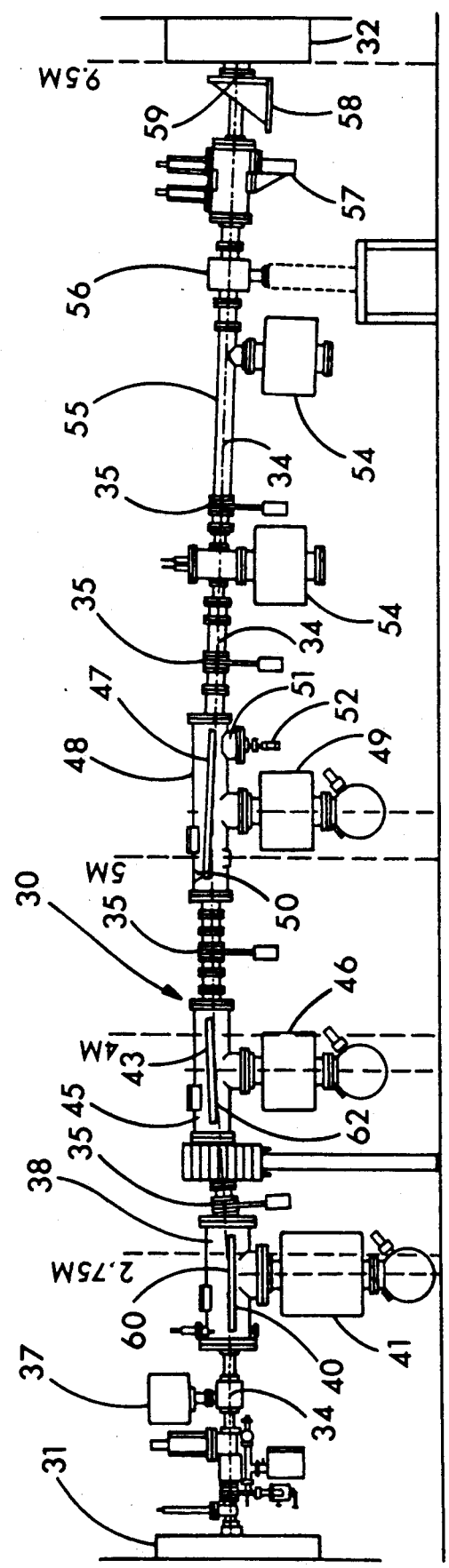
FIG. 5 is a schematic drawing of an X-ray beamline apparatus in accordance with the present invention.

With reference to the drawings, an X-ray beamline apparatus in accordance with the present invention is shown generally at 30 in FIG. 5 receiving synchrotron radiation from a synchrotron 31 and delivering an X-ray beam to a target apparatus 32, such as a holder and stepper for mounting semiconductor wafers which are to be exposed by the X-ray beam. The path of the X-ray beam is indicated by the dashed line 34 in FIG. 5, with its path being fully enclosed by enclosing structure the interior of which is evacuated to a very low pressure. The enclosing mechanical structure for the beamline is preferably constructed to isolate the major components of this system to allow their removal and replacement as modules, and for this purpose gate valves 35 may be interposed between the major components.

For purposes of illustration in FIG. 5, the major components include a fast closure valve 37 which is mounted adjacent to the synchrotron and is capable of closing rapidly to isolate the synchrotron from any failure of the vacuum in the beamline system. The beam of synchrotron radiation 34 exiting the synchrotron 31 enters a first mirror enclosure 38 which mounts a first or entrance mirror 40 and is evacuated by a pump 41. The beam 34 is deflected by the mirror 40 upwardly to a second or refocusing mirror 43 which is mounted within an enclosing structure 45 and is evacuated by a pump 46. The beam 34 is then intercepted by a flat scanning mirror 47 mounted within a containment structure 48 and evacuated by a pump 49. The flat mirror 47 is mounted to pivot about a pivot point 50 and is driven upwardly and downwardly at its opposite end by a drive shaft 51 and a linear actuator 52. The beam then proceeds down the remaining components of the beam path, which preferably include an additional vacuum pump 54, an acoustic delay line 55, a diagnostic mirror assembly 56, and a shutter assembly 57, finally reaching the mounting assembly 58 for the exit window 59. The window 59 closes the exit of the beamline to seal the interior of the beamline from the atmosphere so that it may be evacuated down to an ultra-high vacuum comensurate with that within the synchrotron 31.

Figure 6:
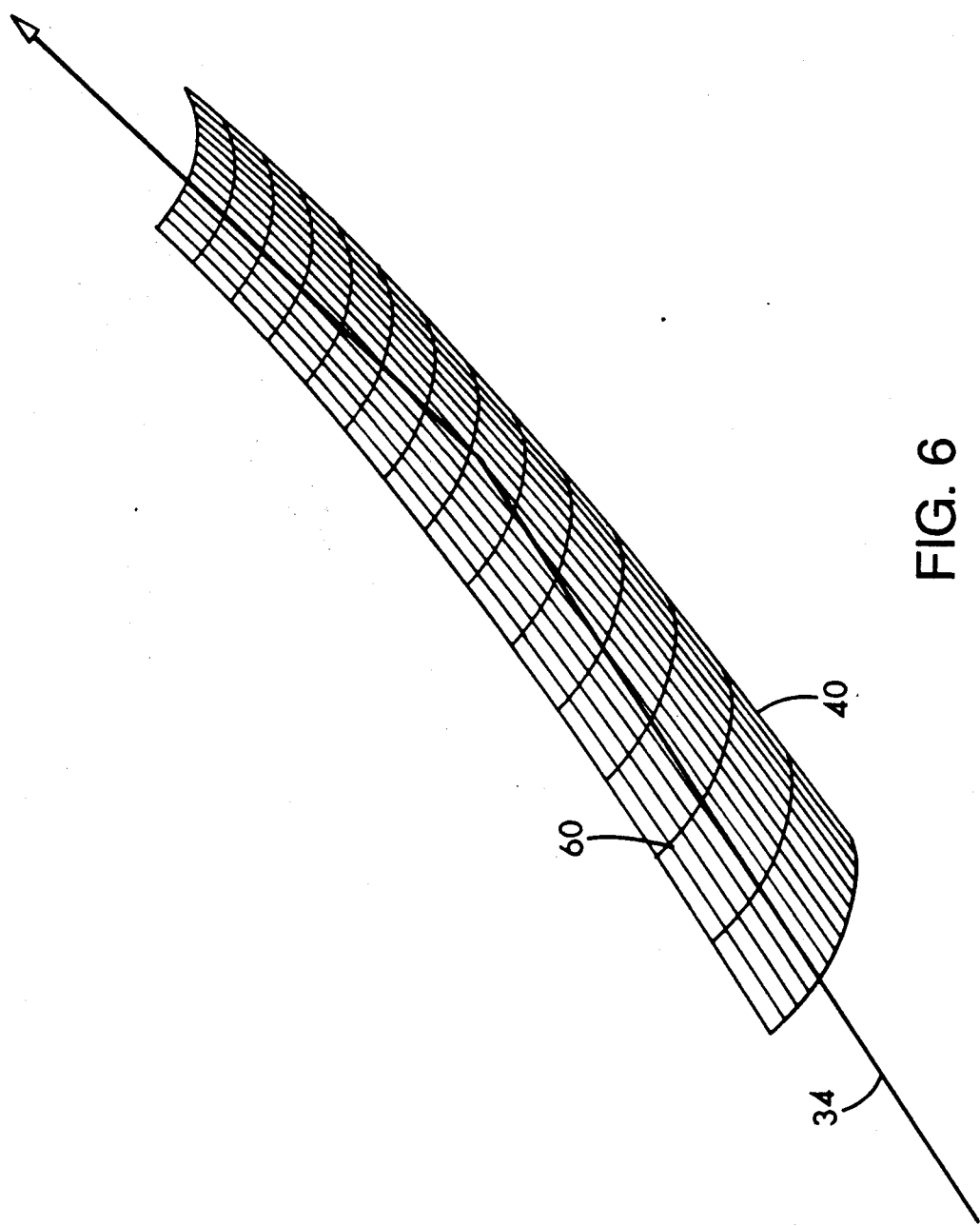
FIG. 6 is an illustrative drawing of the mirror surface of the first or entrance mirror in the beamline appartus of FIG. 5.

The reflecting surface 60 of the first or entrance mirror 40 is illustrated in the schematic view of FIG. 6. The mirror 40 may be formed, for example, of conventional X-ray mirror materials, such as glass or quartz with a coating of gold on the reflective surface 60. The mirror 40 may be ground and polished from a solid blank to the desired surface curvature before the reflective coating is applied. Alternatively, the mirror may be formed from a tube of mirror base material which is cut along its length to the appropriate width and then is bent along its length into a circular path having a large major radius before a reflective coating is formed on the curved surface. The reflective surface 60 of the mirror 40 is in a full toroidal shape which is concave both along its length and its width. This shape may be analogized to the bottom outside surface of an inner tube of a bicycle tire when viewed from the top.

Figure 7:
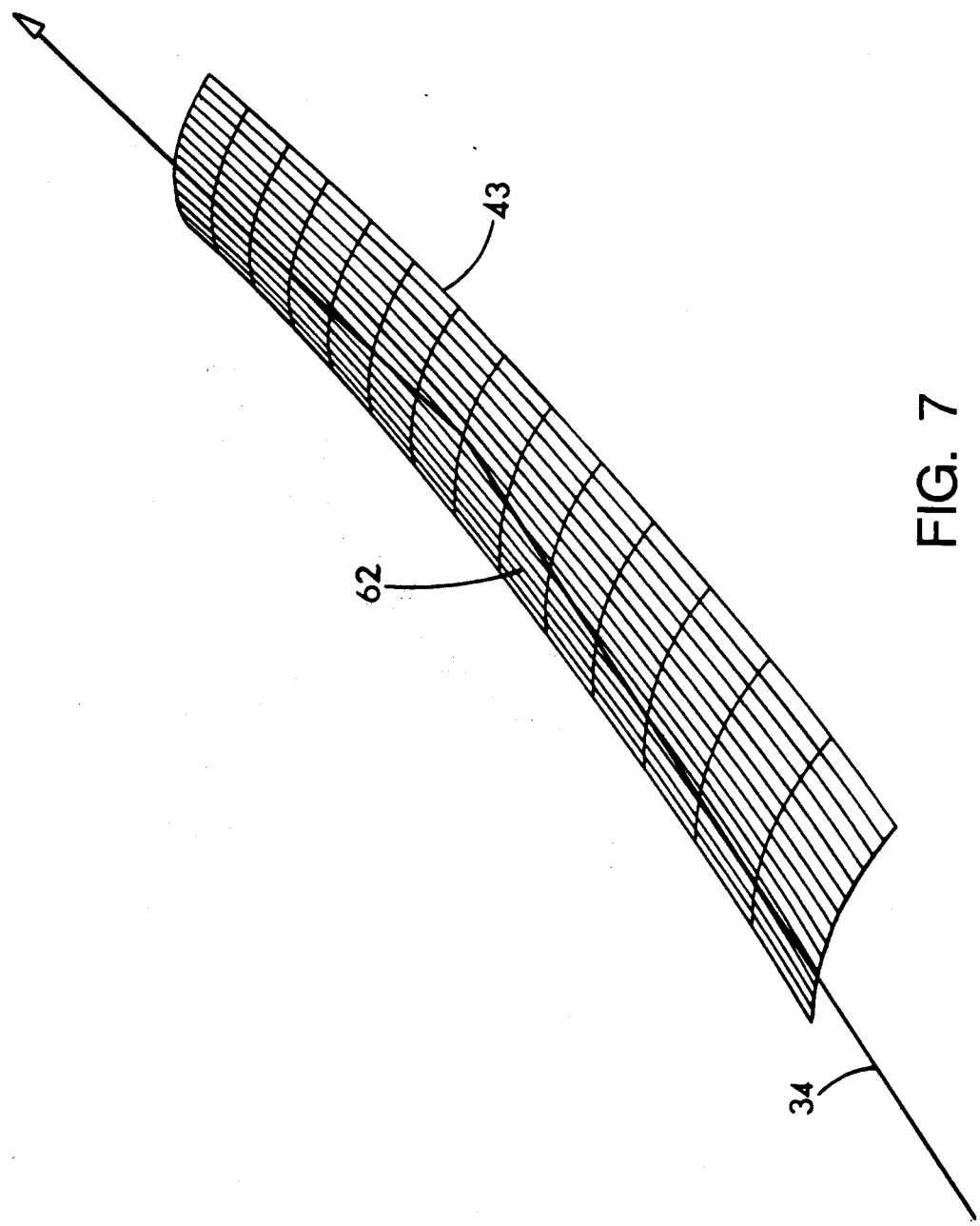
FIG. 7 is an illustrative drawing showing the shape of the second or refocusing mirror in the beamline apparatus of FIG. 5.

The reflecting surface 62 of the second or refocusing mirror 43 is shown illustratively in FIG. 7, it being understood in the beamline arrangement shown in FIG. 5 the mirror 43 is positioned with the reflecting surface 62 facing downwardly, as illustrated in FIG. 5. The mirror 43 again may be formed of conventional materials for X-ray mirrors, such as of a glass or quartz, with the reflecting surface ground and polished from a blank or may be formed from a tube, with the reflecting surface 62 coated with a reflector such as gold. The surface 62 is concave along its length but convex along its width, and it is sometimes referred to as a saddle toroid shape.

Figure 8:
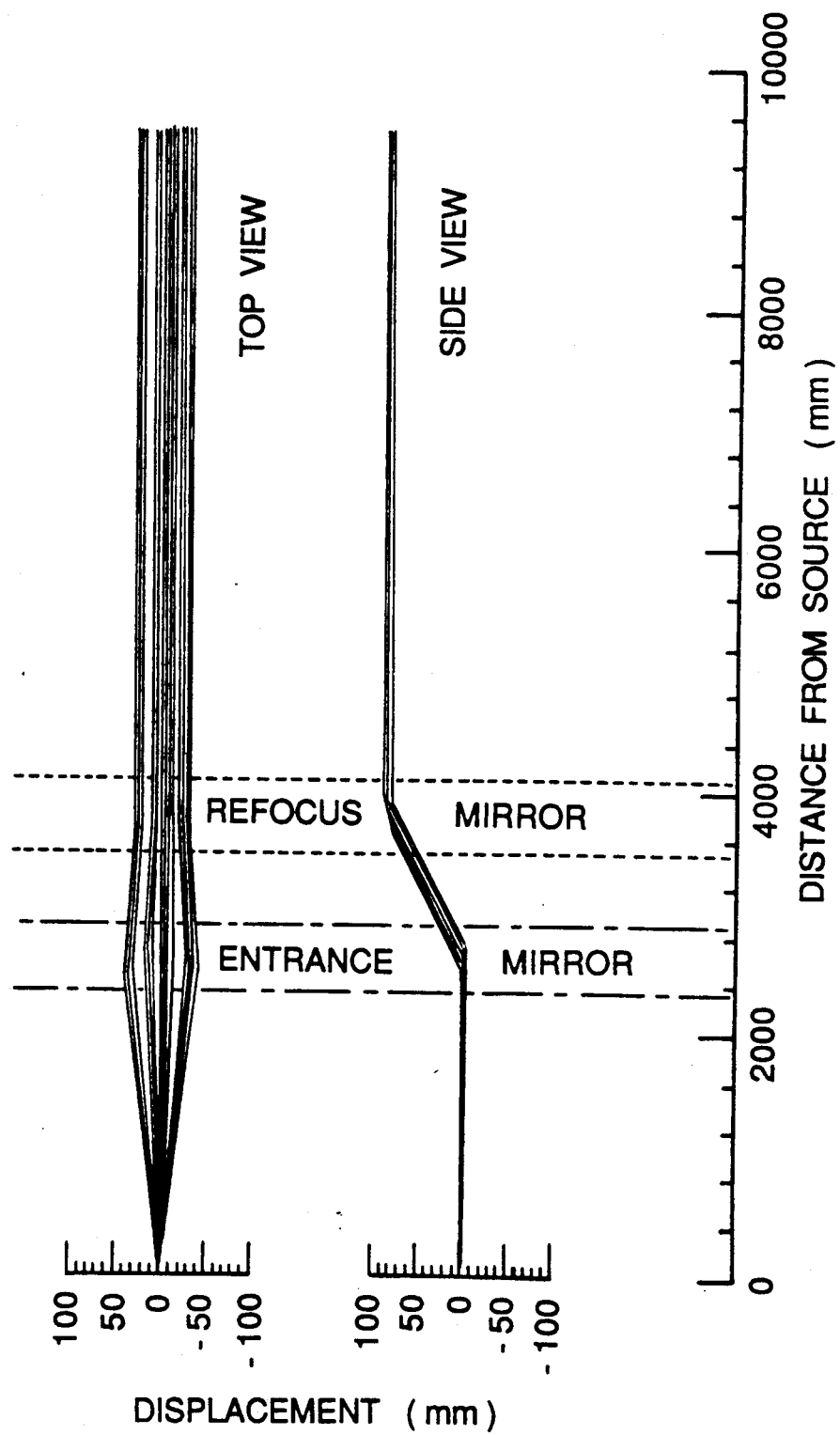
FIG. 8 are graphs showing side and top views of the path of X-rays passing from the synchrotron through the entrance and refocusing mirrors in the beamline apparatus of the present invention.
Figure 9:
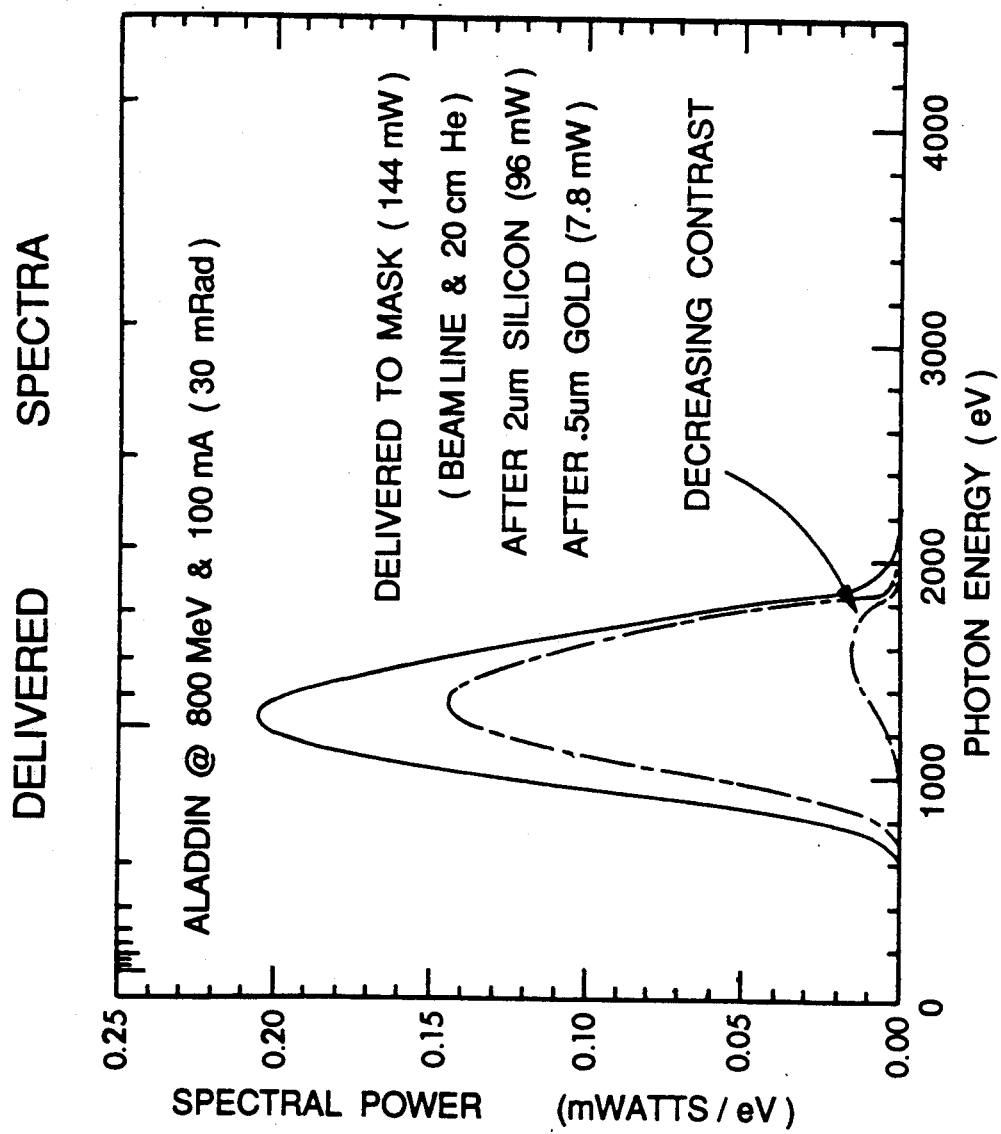
FIG. 9 is a graph showing the spectra of X-rays which are passed through the beamline apparatus of the invention and delivered to an X-ray mask.

FIG. 8 illustrates the effect on the beam 34 of the two mirrors 40 and 43. FIG. 8 includes top and side views of the X-ray lithography beamline showing in exaggerated scale the paths of 20 photons traversing the system from the synchrotron radiation source at the far left of the graph to the exposure field at the far right. It is seen that the first or entrance mirror collects and focuses the photons horizontally and somewhat disperses the photons vertically. The second or refocusing mirror refocuses the X-ray beam vertically and collimates it horizontally. Thus, after passing through both mirrors, the beam is tightly focused vertically into a thin line while being substantially uniform in width horizontally and substantially uniform in power density across its width.

As noted above, the entrance mirror acts to collect the diverging fan of synchrotron radiation and to partially collimate the light horizontally. It is preferably located as close to the synchrotron source as physical constraints will allow. The entrance mirror is preferably mounted to provide a two degree grazing angle of the mirror, which determines the high energy cut-off of the photons at approximately 2000 eV. A smaller grazing angle would increase the overall through-put of the system, but has the disadvantage of passing more of the higher energy photons and also requires that a much longer mirror be formed. Long-mirrors are generally more difficult to fabricate and have longer delivery times and are more costly.

Figure 12:
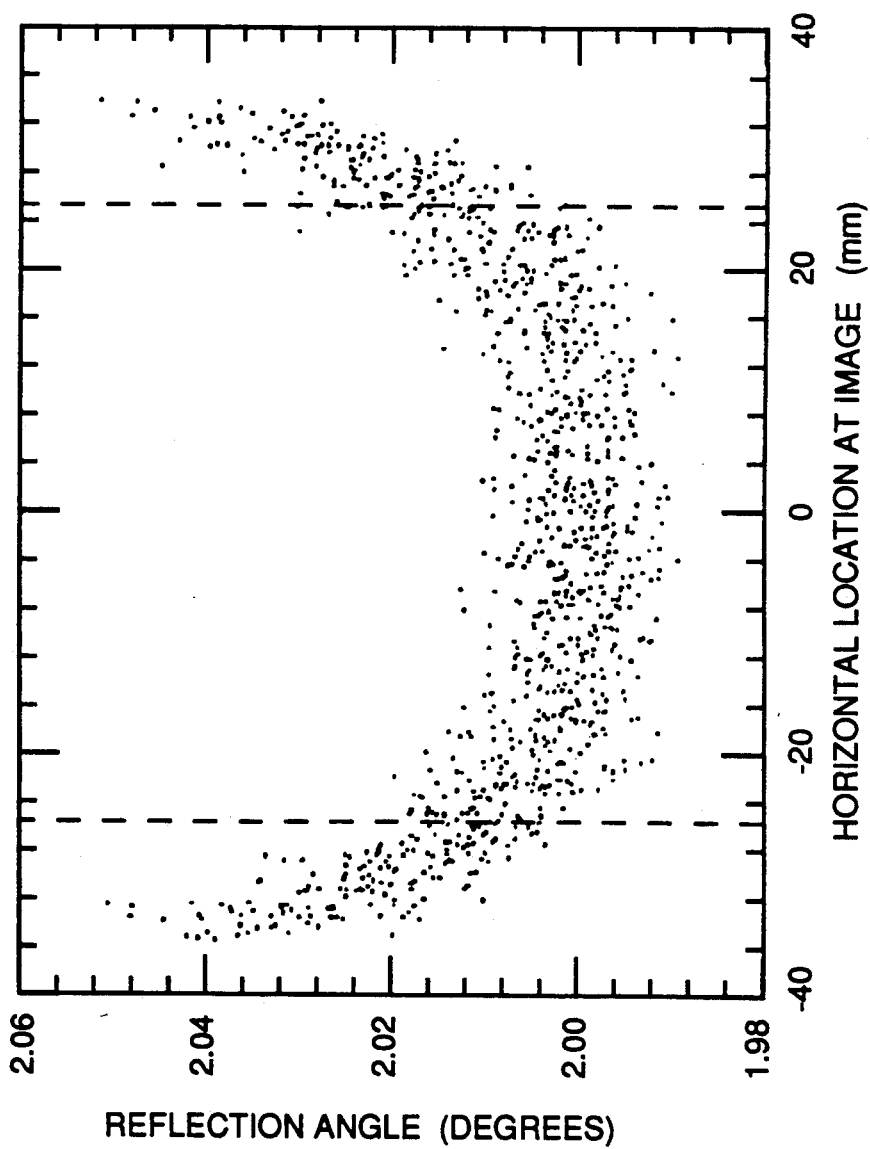
FIG. 12 is a plot of reflection angles at the entrance mirror versus the location at which the X-rays strike the exposure field.
Figure 13:
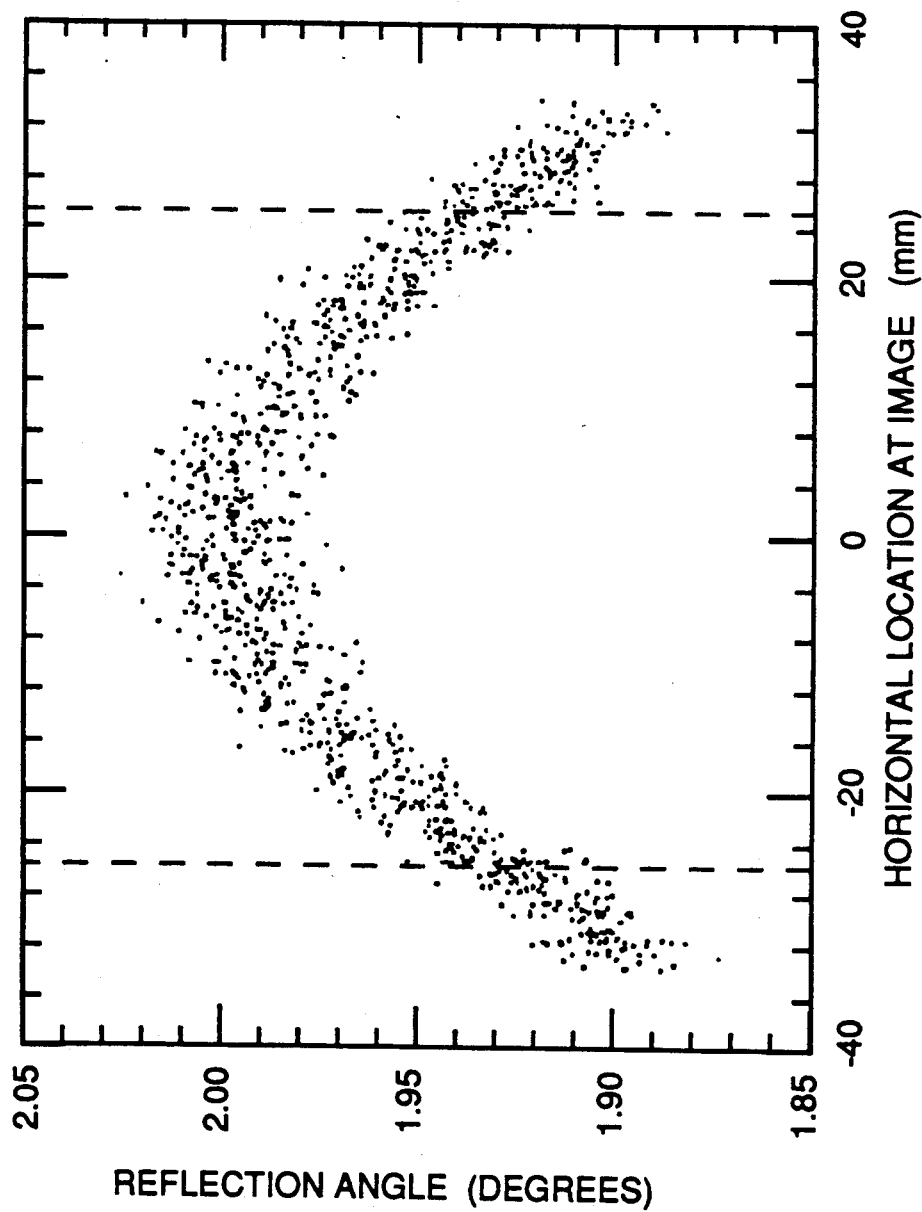
FIG. 13 is plot of reflection angles at the refocusing mirror versus the location at which the X-rays strike the exposure field.

Due to the curvature of the surface 60 of the entrance mirror, photons striking the mirror close to the central axis of the mirror experience a slightly smaller grazing angle than those striking further out. The attenuation of X-rays in this energy region is very sensitive to the angle of incidence: slight increases in the grazing angle greatly increase the attenuation. The grazing angles experienced by the photons across the mirrors provide an indication of the energy losses that can be expected at the exposure field. The effect of the grazing angle is illustrated in FIG. 12 for the first or entrance mirror, in FIG. 13 for the second or refocusing mirror, and in FIG. 14 for the average reflection angle for both mirrors. At a two degree grazing angle the undesirable high energy X-rays are eliminated by attenuation at the reflecting surfaces. Although this grazing angle for the mirrors provides the high energy cut-off need for good contrast, the desired X-ray energies are on the edge of a very steep attenuation curve. Thus, the attenuation of the reflected X-rays is very sensitive to slight changes in the grazing angle. Reflection angles experienced by the X-rays as they traverse the beamline are plotted in FIGS. 12-14 versus the location at which the rays strike the exposure field (for consistency along the horizontal axis). This information indicates where reflectivity losses may occur in the system.

Figure 14:
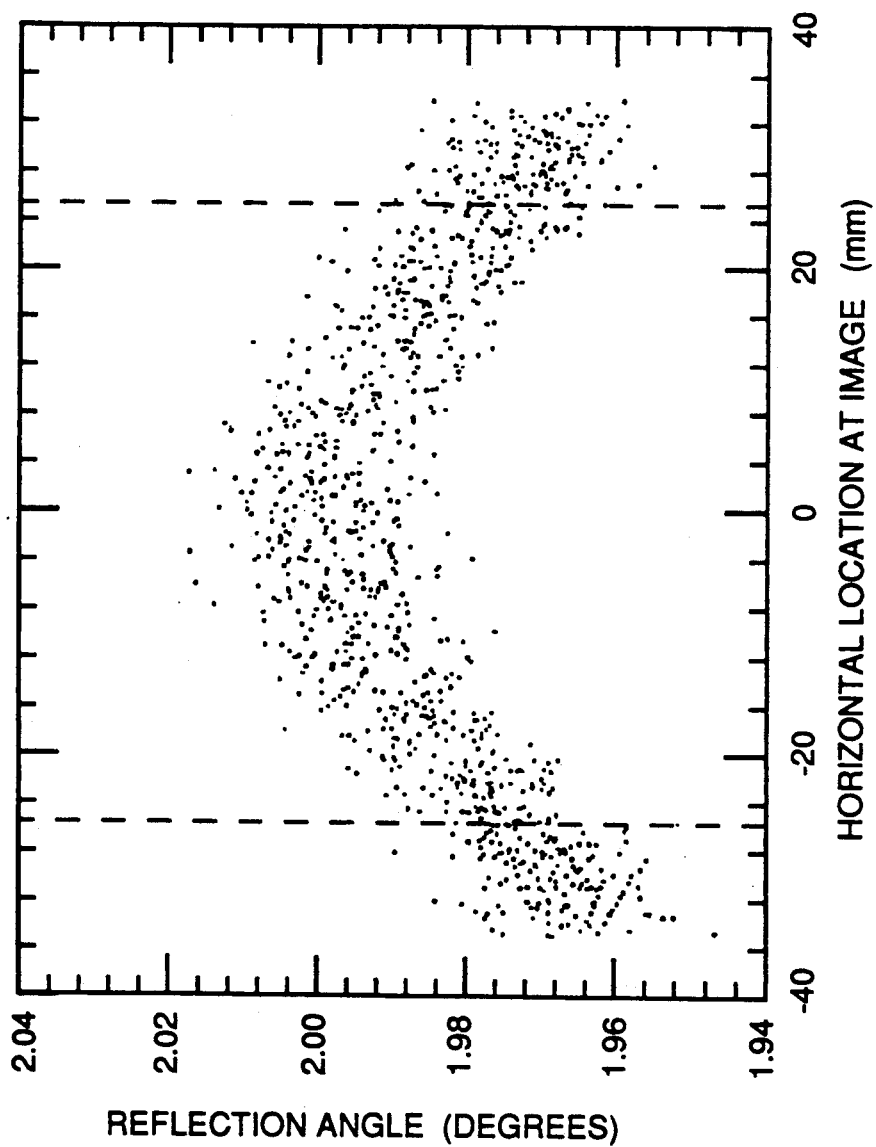
FIG. 14 is a plot of the average reflection angle for X-rays traversing both the entrance and refocusing mirrors versus the location at which the X-rays strike the exposure field.

The refocusing mirror 43 collimates the X-ray beam 34 horizontally and focuses the beam vertically. The curve of the surface of this mirror acts in concert with the curve of the surface of the first mirror to provide a uniform image with uniform power distribution. The saddle toroid shape of the refocusing mirror may be analogized to the bottom inside surface of an inner tube, being concave along its length but convex along its width. This type of mirror may be formed by grinding and polishing the mirror surface from a blank or by cutting a glass tube lengthwise and bending it in a circular shape. Photons striking along the central axis of the refocusing mirror 43 are attenuated less than those striking near the edges due to the curvature of the surface, in a manner contrary to that which occurs with the entrance mirror. Since the reflection angles are closely linked to the attenuation and through-put, spectral uniformity can be improved by the proper arrangement of the two mirrors. For example, two concave-concave toroids working together could provide the same number of focusing parameters, but the attenuation factors of both mirrors would tend to attenuate the outer photons the most. With one mirror being a concave/concave toroid and the other a concave/convex or saddle toroid, the attenuation factors work differently on the inner and outer photons at each mirror to produce a more uniform power distribution at the exposure field, as illustrated in the graph of FIG. 14 which shows the average reflection angle for the two mirrors taken together. It is seen that this average reflection angle has less deviation horizontally than either one of the mirrors separately.

Figure 15:
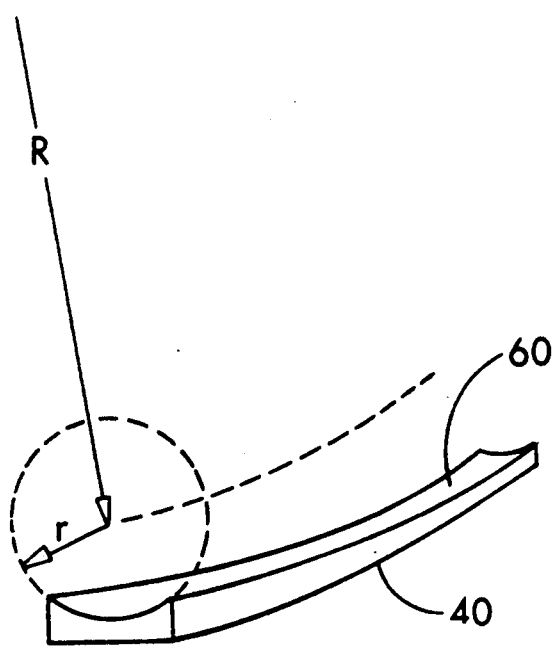
FIG. 15 is a schematic drawing of the entrance mirror showing the minor and major radii of curvature for the reflecting surface.
Figure 16:
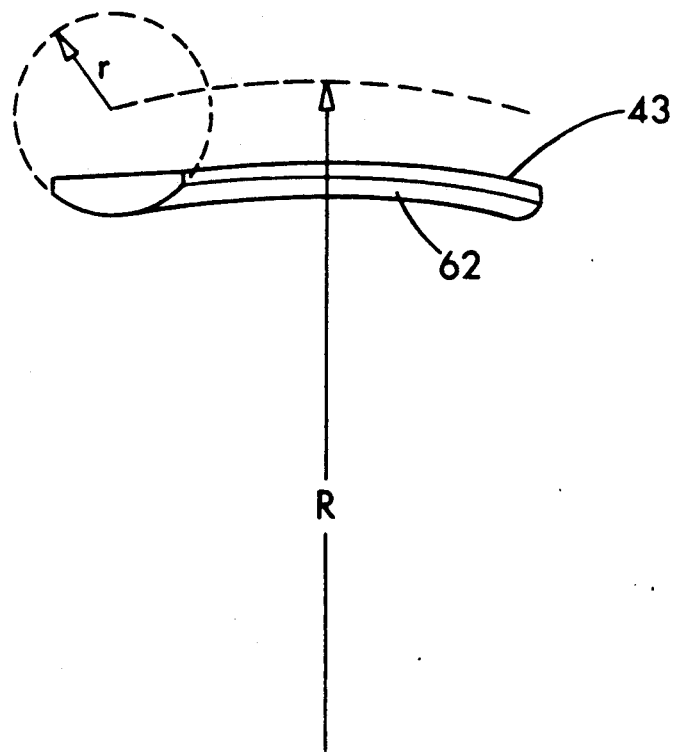
FIG. 16 is a schematic drawing of the refocusing mirror showing the minor and major radii of curvature for the minor and major reflecting surfaces.

The particular dimensions of the mirrors and the spacing and orientation of the mirrors will generally be optimized to the synchrotron system and to the particular applications. Exemplary dimensions for a system utilizing synchrotron radiation from the Aladdin synchrotron storage ring include a major radius for the surface 60 of the mirror 40 of 140.6 meters and a minor radius of 108.15 millimeters, a major radius for the surface 62 of the mirror 43 of 331.57 meters and a minor radius of 161.55 millimeters, with the major radius R and the minor radius r determined as illustrated in the views of FIG. 15 for the mirror 40 and in FIG. 16 for the mirror 43. For both mirrors, the major radius R is measured to the center axis of the mirror radius.

Figure 10:
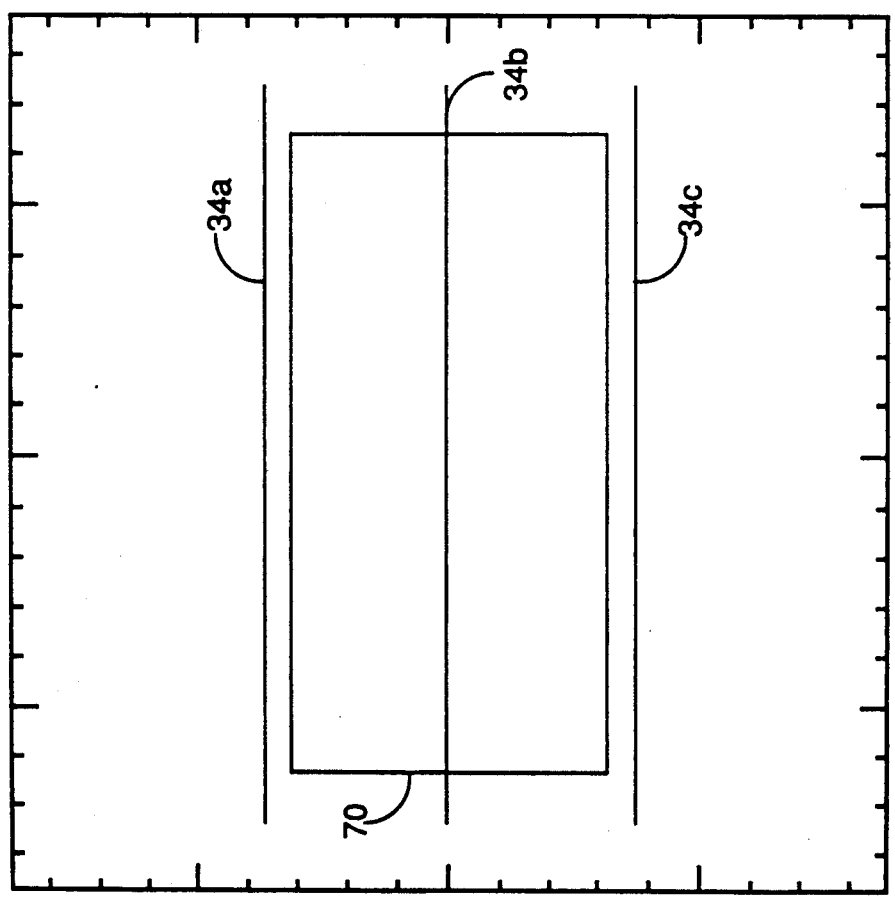
FIG. 10 is an illustration of images produced during the scan of a 2 inch by 1 inch exposure field at different tilt angles of the scanning mirror of the apparatus of the invention.

The planar scanning mirror 47 is formed with an optically flat surface, in a conventional fashion, and may be formed of a flat plate of glass with a coating of gold on its reflecting surface. The flat scanning mirror preferably has a nominal grazing angle of 1 degree although the X-ray may strike the mirror at various grazing angles between about 0.2° and 4°. The movement of the scanning mirror up and down to charge the angle of incidence of the beam 34 results in a change in the position of the image of the beam 34 at the exposure field. This is illustrated in FIG. 10 where three positions of the beam are shown, a first position 34a at which the beam is at the top of the exposure field 70, a second position 34b at the middle of the exposure field, and a third position 34c at the bottom of the exposure field. The image of the beam provided by the present system is very thin, as illustrated in FIG. 10. For example, exemplary dimensions are 60 millimeters across by 4 millimeters in thickness.

Exemplary spacing for the mirrors in the system described above includes positioning the entrance mirror 2.75 meters from the source and at the source plane, the refocusing mirror 4 meters from the source and 87 millimeters above the source plane, the flat scanning mirror 5 meters from the source and 87 millimeters above the source plane, and the image plane at 9.37 meters from the source and 65 millimeters below the source plane.

Very slight changes in the location and tilt of the entrance mirror 40 and the refocusing mirror 43 can be used to alter the distance to the final image without compromising either the power or the uniformity of the image shape. This adjustability extends across a wide enough range to provide the ability to dramatically alter the length of the beamline. By shifting the location of the final images for neighboring beamlines, the locations of the stepper which hold the wafers can be staggered, easing their accessability in crowded work locations. In addition, the mirrors 40 and 43 may be made bendable to allow the major radius to be varied by use of an adjustment mechanism. At the low grazing angles utilized, only a very slight change in the curvature along the length of the mirrors is necessary for optimal focusing.

Full field coverage of the beam may be provided as described above by scanning the image vertically across the exposure field by use of the flat mirror 47. Alternatively, scanning may be accomplished by translating the wafer and mask together through the X-ray beam. With a scanning mirror having a grazing angle of 1 degree or less, the energy dependence of the reflectivity of the flat mirror is in a nearly flat portion of the reflectivity curves for most of the materials used to coat X-ray mirrors. The small grazing angles used imply higher overall reflectivities, but also require longer, more costly mirrors.

The beryllium window 59 acts to isolate the ultra-high vacuum portion of the beamline (containing all the optical elements) from the stepper system 32, which conventionally will be operating in an atmosphere of helium. A typical thickness for the beryllium window is 13 to 15 microns, allowing the window to act also as a high pass filter, cutting out the undesirable, lower energy X-ray wavelengths. It is possible to tailor the thickness of the beryllium window as a means for correcting for slight nonuniformities in the final power profile of the image.

X-ray lithography relies on chemical changes in the photo-resist that are caused by exposure to the X-ray photons. This process is similar in some ways to the more familiar photographic processes that produce black and white pictures. A "negative" (the mask) holds the pattern for the circuits and the structures to be transferred to the surface of the silicon wafer. The supporting membrane of the mask is relatively transparent and supports regions coated with a material that is not very transparent to X-rays. When illuminated by an X-ray beam, these non-transparent regions cast shadows onto the wafer. A chemical compound, the photo-resist, undergoes chemical changes where it is illuminated by the X-rays. The exposed wafer is then treated with chemical developers which react with the photo-resist and remove the exposed areas (in the case of positive-resist) or the unexposed areas (in the case of negative-resist). The threshold between the power dosage required to cause the change and the unchanged dosage can be very sharp. Nevertheless, changes in delivered doses from one part of the exposure field to the other have unwanted effects on the quality of the image and the final product. Generally, microdevices to be produced by X-ray lithography may require at least full field exposures across a 1 inch by 1 inch field and desirably will have exposures across a 2 inch by 2 inch field. The processing costs involved in such large devices will be quite large, and thus high failure rates resulting from underexposures or overexposures of regions within the exposure field will be unacceptable.

Figure 11:
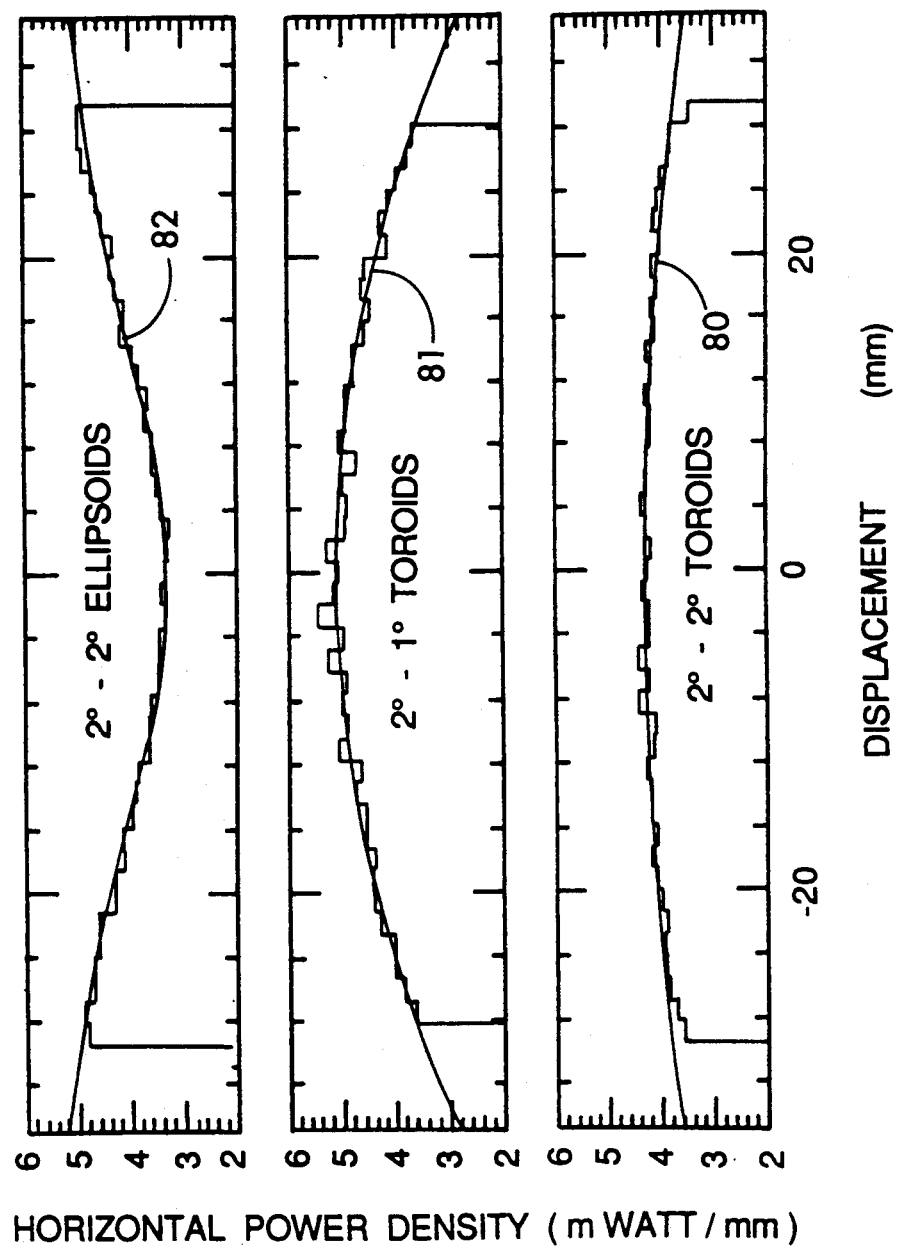
FIG. 11 are illustrative curves showing power density distributions at the image plane for three mirror configurations, including 2 degree and 2 degree grazing incidence ellipsoid mirrors, 2 degree and 1 degree toroid mirrors, and 2 degree and 2 degree toroid mirrors.

FIG. 11 illustrates power density studies performed on three beamline configurations to illustrate the comparative power distribution. The graph labeled 80 in FIG. 11 was obtained with the two toroidal mirrors 40 and 43 described above, each mounted at a 2 degree grazing angle. The graph labeled 81 in FIG. 11 is for a system in which the second or refocusing toroid is mounted at a grazing angle of 1 degree. The graph labeled 82 is for two mirrors having ellipsoidal shapes, rather than toroidal shapes, substituted for the mirrors 40 and 43, each having a 2 degree grazing angle. Both of the ellipsoidal mirrors are concave. All three of the curves 80-82 are plotted at the same scale, although the middle one is shifted slightly due to the higher through-put of the 1 degree mirror. The histograms underlying each of the curves 80-82 are the plotted results of power density calculations with 500,000 rays. The curves 80-82 are fitted to the histogram data using fourth power polynomial fits. These curves illustrate that the system utilizing 2 degree grazing angle toroidal mirrors gives the most uniform power distribution across the image field. As can be seen from the graph 80, the intensity using such mirrors tends to decrease only slightly toward the edges. Thus, slight modifications to the optics can provide a nearly linear response (to within 95%) over the entire 2 inch image field. The tradeoffs involved include slight changes in the image shape or divergence, or both. Small corrections in the power nonuniformity can be compensated by using thin filters with tapered thickness profiles for the window. Corrections that rely on the absorptive characteristics of various thicknesses of filters will have an impact on the shape of the transmitted spectrum. Thus, starting with an optical system that delivers an extremely uniform power distribution and spectral response, as does the present invention, carries with it less need to clean up the image afterwards.

Correcting the residual non-uniformities in the power at the image can be accomplished using filters or windows with tailored thickness profiles. As long as the required tailoring is slight, the attenuation produced will not affect the transmitted spectra. The procedure requires first mapping the power-density at the exposure-field. This can be accomplished by rastering any suitable detector across the exposure field. Knowing that the attenuation produced by an absorbing material is related to the thickness of the material by $I = I_0(e^{-\gamma t})$, one can easily calculate the additional absorber thickness required to attenuate the beam to the desired intensity, I. The analysis then provides an 'additional thickness' map. Various techniques are commonly employed during vacuum deposition to provide coatings with varying thickness profiles; such techniques can be as simple as positioning one part of the substrate closer to the source than the the other, or as elaborate as utilizing a planetary motion system and a series of baffles.

Figure 17:
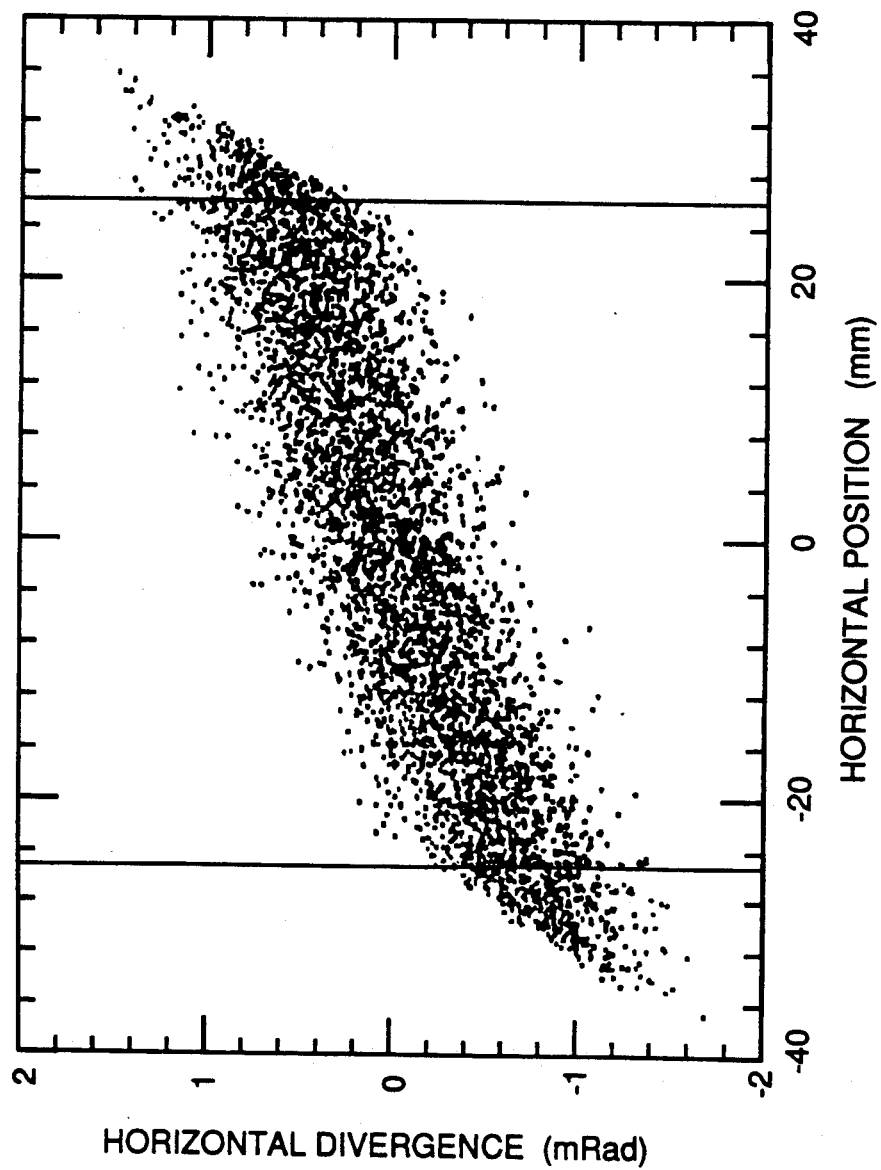
FIG. 17 is an exemplary plot of the horizontal divergence versus horizontal position for the image at the image plane.
Figure 18:
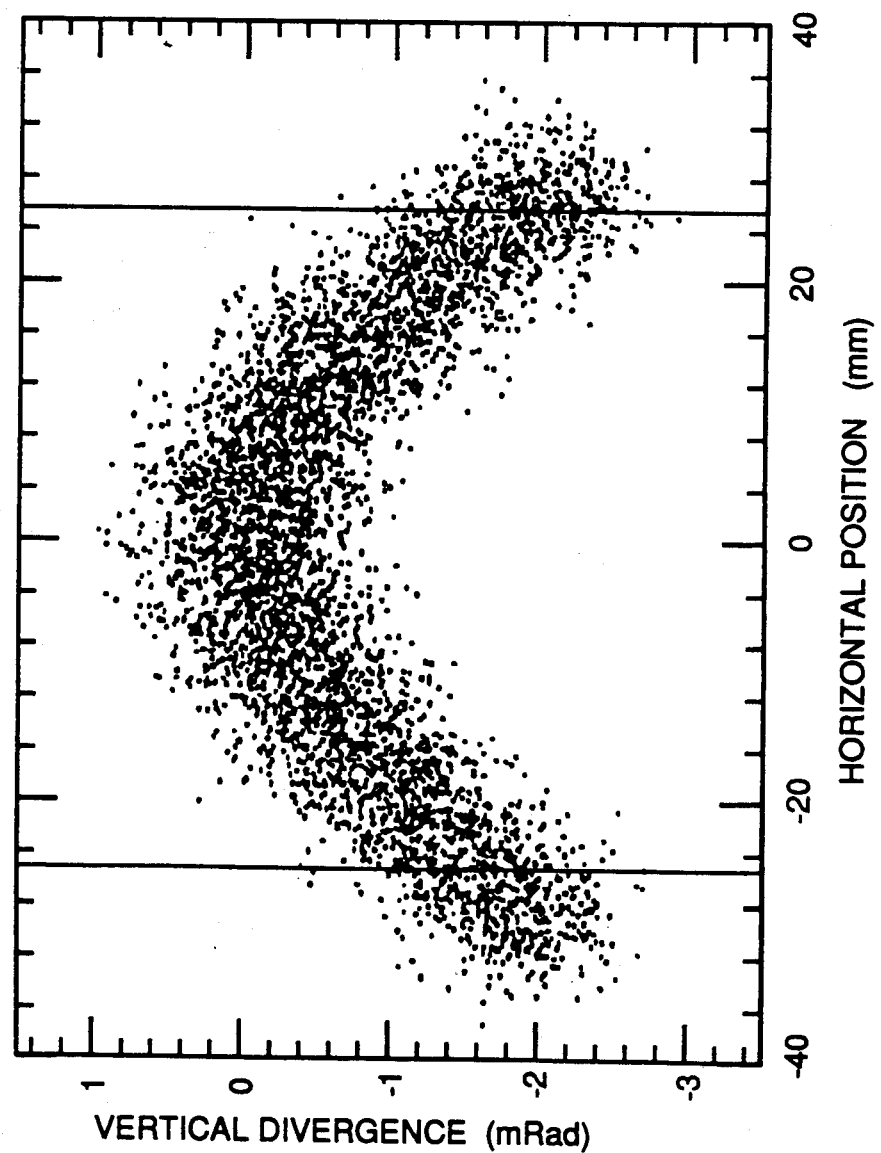
FIG. 18 is an exemplary plot of vertical divergence versus horizontal position for the image at the image plane.

Divergence of the beam provides important information related to the quality of the image projected from the mask to the photoresist. Using divergence plots such as the ones shown in FIGS. 17 and 18, the mask-maker can predict runout and other divergence induced errors and make adjustments to the mask-writing software to build-in compensation if necessary. Raytracing programs, such as SHADOW, can provide the required divergence plots and numerical analysis programs can provide a calculated 'best-fit' formula. The technique of providing the computer controlling the mask-writing tool with the best-fit formula and writing out a corrected mask is well known to the lithography industry.

The present invention thus comprises a unique combination of two mirrors which are ideally suited for collecting synchrotron radiation and focusing it to a line image at an X-ray lithography exposure field. The concave/concave mirror and the concave/convex (saddle) mirror work together to provide excellent focusing capabilities with an extremely uniform power distribution across the exposure field. The system also delivers X-rays that are extremely well matched to the mask/photo-resist requirements. Low energy photons that contribute to mask heating are eliminated by the beryllium window, while the high energy photons that reduce image contrast are eliminated by the grazing optics. The result is a good flux of effective photons and a substantial production through-put. The arrangement of the system provides a flexible beamline that can be varied in length without respecifying the optics. Fully modular components are thus permitted which can be changed quickly and simply, eliminating lengthy down time for replacement and bakeouts. It is also possible to use entrance and refocusing mirrors in the present invention which are not true toroids. For appropriate applications, the reflecting surfaces may be generic polynomial surfaces (e.g., up to the 6th order), approximating figures of rotation of conic section, for example, rotation ellipsoids or saddle hyperboloids.

It is understood that the invention is not limited to the particular embodiments set forth herein, but embraces such modified forms thereof as come within the scope of the following claims.

What is claimed is:

1. Beamline apparatus for X-ray lithography which receives synchrotron radiation comprising:
   (a) a first, entrance mirror in the beamline with a reflecting surface which is concave along its width and concave along its length, positioned to receive the fan of radiation from a synchrotron at a grazing angle and to partially collimate the X-rays in one dimension;
   (b) a second, refocusing mirror positioned to receive the X-rays reflected from the entrance mirror at a grazing angle, the refocusing mirror having a reflecting surface which is concave along its length and convex along its width, the refocusing mirror acting to collimate the X-rays horizontally and to focus the X-rays vertically, the entrance mirror and the refocusing mirror positioned to cooperate to provide a beam having a substantially uniform image at an image plane with a substantially uniform power distribution.

2. The apparatus of claim 1 wherein the entrance mirror and the refocusing mirror each have a grazing angle to the X-rays of approximately 2 degrees.

3. The apparatus of claim 1 including structure enclosing the beamline along its length including the entrance and refocusing mirrors and a window closing the end of the beamline to seal the interior of the beamline from the external atmosphere and to cooperate with the entrance and refocusing mirrors to provide an X-ray beam as passed through the window which has X-rays above and below a desired energy band substantially attenuated.

4. The apparatus of claim 3 wherein the window is formed of beryllium.

5. The apparatus of claim 3 wherein the window has a variable thickness to compensate for non-uniform power distribution.

6. The apparatus of claim 1 further including a flat scanning mirror positioned to engage the X-ray beam reflected from the refocusing mirror and mounted to pivot to change the position of the beam at the image plane.

7. The apparatus of claim 6 wherein the flat scanning mirror has a nominal grazing angle between about 0.2 degree and 4 degrees with respect to the beam.

8. The apparatus of claim 1 wherein the entrance mirror reflecting surface is toroidal and has a major radius of curvature of approximately 140 meters and a minor radius of curvature of approximately 108 millimeters, and wherein the refocusing mirror reflecting surface is torodial and has a major radius of curvature of approximately 332 meters and a minor radius of curvature of approximately 162 millimeters.

9. A method of focusing and collimating a beam of X-rays from a synchrotron comprising the steps of:
   (a) intercepting the fan of X-rays in the synchrotron radiation from a synchrotron at a grazing angle with a first mirror having a concave/concave toroidal reflecting surface which has a major radius of curvature and a minor radius of curvature and reflecting the X-rays from that surface to collect the diverging fan of X-rays from the synchrotron and to partially collimate the X-rays horizontally; and
   (b) intercepting the beam reflected from the first mirror at a grazing angle with a second mirror having a concave/convex toroidal reflecting surface, the toroidal surface having a major radius of curvature along its concave length and a minor radius of curvature along its convex width, the second mirror reflecting the X-rays to collimate the X-rays horizontally and to focus the X-rays vertically.

10. The method of claim 9 further including the steps of intercepting the focused and collimated X-rays from the second mirror with a flat mirror and pivoting the flat mirror up and down to reflect the beam from the reflecting surface of the flat mirror to an image plane to scan the beam across the image plane.

11. The method of claim 10 wherein the X-rays meet the flat mirror at a grazing angle between about 0.2 degree and 4 degrees.

12. The method of claim 9 wherein the first and second mirrors each have a grazing angle to the X-ray of approximately 2 degrees.

13. An X-ray beamline for X-ray lithography which receives synchrotron radiation comprising:
   (a) a first, entrance mirror in the beamline with a reflecting surface which is concave along its width and concave along its length, positioned to receive the fan of radiation from a synchrotron at a grazing angle and to partially collimate the X-rays in one dimension;
   (b) a second, refocusing mirror positioned to receive the X-rays reflected from the entrance mirror at a grazing angle, the refocusing mirror having a reflecting surface which is concave along its length and convex along its width, the refocusing mirror acting to collimate the X-rays horizontally and to focus the X-rays vertically, the entrance mirror and the refocusing mirror positioned to cooperate to provide a beam having a substantially uniform image at an image plane with a substantially uniform power distribution;
   (c) structure enclosing the beamline along its length including the entrance and refocusing mirrors and a window closing the end of the beamline to seal the interior of the beamline from the external atmosphere and to cooperate with the entrance and refocusing mirrors to provide an X-ray beam as passed through the window which has X-rays above and below a desired energy band substantially attenuated.

14. The beamline of claim 13 wherein the entrance mirror and the refocusing mirror each have a grazing angle to the X-rays of approximately 2 degrees.

15. The beamline of claim 13 wherein the window is formed of beryllium.

16. The beamline of claim 13 wherein the window has a variable thickness to compensate for non-uniform power distribution.

17. The beamline of claim 13 further including a flat scanning mirror positioned to engage the X-ray beam reflected from the refocusing mirror and mounted to pivot to change the position of the beam at the image plane.

18. The beamline of claim 17 wherein the flat scanning mirror has a nominal grazing angle between about 0.2 degree and 4 degrees with respect to the beam.

19. The beamline of claim 13 wherein the entrance mirror reflecting surface is toroidal and has a major radius of curvature of approximately 140 meters and a minor radius of curvature of approximately 108 millimeters, and wherein the refocusing mirror reflecting surface is torodial and has a major radius of curvature of approximately 332 meters and a minor radius of curvature of approximately 162 millimeters.

* * * * *